(12) United States Patent
Hou

(10) Patent No.: US 8,823,897 B2
(45) Date of Patent: Sep. 2, 2014

(54) DISPLAY DEVICE, LIQUID CRYSTAL MODULE, AND FIXING STRUCTURE

(75) Inventor: Hung-Lung Hou, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 183 days.

(21) Appl. No.: 13/499,676

(22) PCT Filed: Jan. 30, 2012

(86) PCT No.: PCT/CN2012/070749
§ 371 (c)(1),
(2), (4) Date: Mar. 30, 2012

(87) PCT Pub. No.: WO2013/078784
PCT Pub. Date: Jun. 6, 2013

(65) Prior Publication Data
US 2013/0135554 A1    May 30, 2013

(30) Foreign Application Priority Data

Nov. 29, 2011  (CN) .......................... 2011 1 0387507

(51) Int. Cl.
*G02F 1/1333* (2006.01)
*G02F 1/1345* (2006.01)

(52) U.S. Cl.
USPC ............................................. 349/58; 349/149

(58) Field of Classification Search
USPC .......................................................... 349/58
See application file for complete search history.

(56) References Cited

U.S. PATENT DOCUMENTS

| 7,295,094 | B2* | 11/2007 | Jitaru et al. | 336/200 |
| 2008/0123016 | A1* | 5/2008 | Kwak et al. | 349/59 |
| 2012/0112865 | A1* | 5/2012 | Fullerton et al. | 335/306 |

FOREIGN PATENT DOCUMENTS

JP          62146479 A  *  6/1987 ............. G11B 33/12

OTHER PUBLICATIONS

Nakamori et al., Device for Fitting Printed Circuit Board, Jun. 30, 1987, English abstract from Patent Abstracts of Japan website, All Pages.*

* cited by examiner

*Primary Examiner* — Dennis Y Kim
(74) *Attorney, Agent, or Firm* — Cheng-Ju Chiang

(57) ABSTRACT

The present invention discloses a liquid crystal module, which includes a back panel, a circuit board, and a circuit board cover. The circuit board is attached to the back panel by magnetic members. The circuit board cover is attached to the back panel by magnetic members. In addition, the invention discloses a fixing structure and a display device that includes the liquid crystal module. The display device, the liquid crystal module, and the fixing structure thereof disclosed in the present invention use magnetic members to fix the circuit board and the circuit board cover to the back panel. This simplifies the assembling operation, allows of easy maintenance and replacement of the circuit board, makes it possible to efficiently remove the circuit board cover for conducting flaw inspection and related electrical test on the circuit board, improves the production efficiency of liquid crystal display devices, and lowers down the manufacturing cost.

10 Claims, 2 Drawing Sheets

DISPLAY DEVICE, LIQUID CRYSTAL MODULE, AND FIXING STRUCTURE

BACKGROUND OF THE INVENTION

1. Field of the Invention

The present invention relates to the field of displaying techniques, and in particular to a display device, a liquid crystal module, and a fixing structure thereof.

2. The Related Arts

It is known that a liquid crystal module of TFT-LCD (Thin Film Transistor Liquid Crystal Display) uses a circuit board, such as COB (Control of Board) to allow signals to be converted in the circuit board for output to a liquid crystal panel to drive the liquid crystal panel displaying a desired image.

Specifically, in the state of the art, a liquid crystal module comprises a back panel, a circuit board, and a circuit board cover. The back panel is made of metal and the circuit board and the circuit board cover are fixed to the back panel by screws.

To conduct flaw inspection and related electrical test on a circuit board, such as inspection of poor level adjustment and abnormal image, it needs to first open the circuit board cover. To open the circuit board cover, a screwdriver must be used to remove the screws one by one. After that, the flaw inspection and related electrical test can be performed. In addition, when it needs to carry out maintenance operations or to replace the circuit board, it also needs to use a screwdriver to remove the screws that fix the circuit board.

Apparently, in the state of the art, since the circuit board and the circuit board cover are fixed to the back panel by screws, it becomes troublesome to maintain or replace the circuit board and the process of flaw inspection and related electrical test of the liquid crystal module is tedious, efficiency-uneconomic, and time-consuming, and thus significantly affecting the production efficiency of display devices and the liquid crystal modules thereof.

SUMMARY OF THE INVENTION

The present invention provides a display device, a liquid crystal module, and a fixing structure thereof, which overcome the problems of the conventional techniques that due to a circuit board and a circuit board cover being fixed to a back panel by screws, maintaining or replacing the circuit board becomes troublesome and the process flaw inspection and related electrical test of the liquid crystal module is tedious, efficiency-uneconomic, and time-consuming and thus significantly affecting the production efficiency of display devices and the liquid crystal modules thereof.

To overcome the above discussed technical problems, the present invention adopts a technical solution by providing a liquid crystal module, which comprises:

a back panel;

a circuit board, which is attached to the back panel by magnetic members; and a circuit board cover, which is attached to the back panel by magnetic members.

According to a preferred embodiment of the present invention, the magnetic members are mounted to the circuit board and the circuit board cover through integral plastic molding, inlaying, bonding adhesive.

According to a preferred embodiment of the present invention, the magnetic members are arranged on the circuit board cover in a distributed manner.

According to a preferred embodiment of the present invention, the magnetic members are respectively set at four corners of the circuit board cover.

According to a preferred embodiment of the present invention, the back panel and/or the circuit board is provided with at least one positioning piece.

According to a preferred embodiment of the present invention, the circuit board and the circuit board cover form positioning sections mateable with the positioning piece.

According to a preferred embodiment of the present invention, the positioning piece is a positioning pin and the positioning sections are positioning holes.

To overcome the above discussed technical problems, the present invention adopts a technical solution by providing a display device, which comprises the liquid crystal module described above.

To overcome the above discussed technical problems, the present invention adopts a technical solution by providing a fixing structure, which fixes a circuit board and a circuit board cover of a liquid crystal module to a back panel. The fixing structure comprises magnetic members that are mounted to the circuit board and the circuit board cover, whereby with magnetic forces that the magnetic members apply to attractively couple to back panel, the circuit board and the circuit board cover are fixed to the back panel.

The efficacy of the present invention is that to be distinguished from the state of the art, the display device, the liquid crystal module, and the fixing structure thereof disclosed in the present invention use magnetic members to fix the circuit board and the circuit board cover to the back panel. This simplifies the assembling operation, allows of easy maintenance and replacement of the circuit board, makes it possible to efficiently remove the circuit board cover for conducting flaw inspection and related electrical test on the circuit board, improves the production efficiency of liquid crystal display devices, and lowers down the manufacturing cost. When it attempts to maintain or replace the circuit board or when it attempts to conduct flaw inspection and related electrical test on the liquid crystal module, there is no need to remove screws with a screwdriver and the circuit board and the circuit board cover can be simply removed by forcibly pulling off, this being of high efficiency and great convenience.

BRIEF DESCRIPTION OF THE DRAWINGS

To more clearly expound the technical solution adopted in the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

A clear and complete description of the technical solution adopted in the embodiments of the present invention will be given below with reference to the attached drawings associated with the embodiments of the present invention. It is apparent that the embodiments that will be described are only a few of the embodiments available for the present invention, and are not all the available embodiment of the present invention. Based on the embodiments of the present invention, those having ordinary skills in the art may, without putting in any creative efforts, easily obtain other embodiments that are considered within the protection scope of the present invention.

Figure 1:
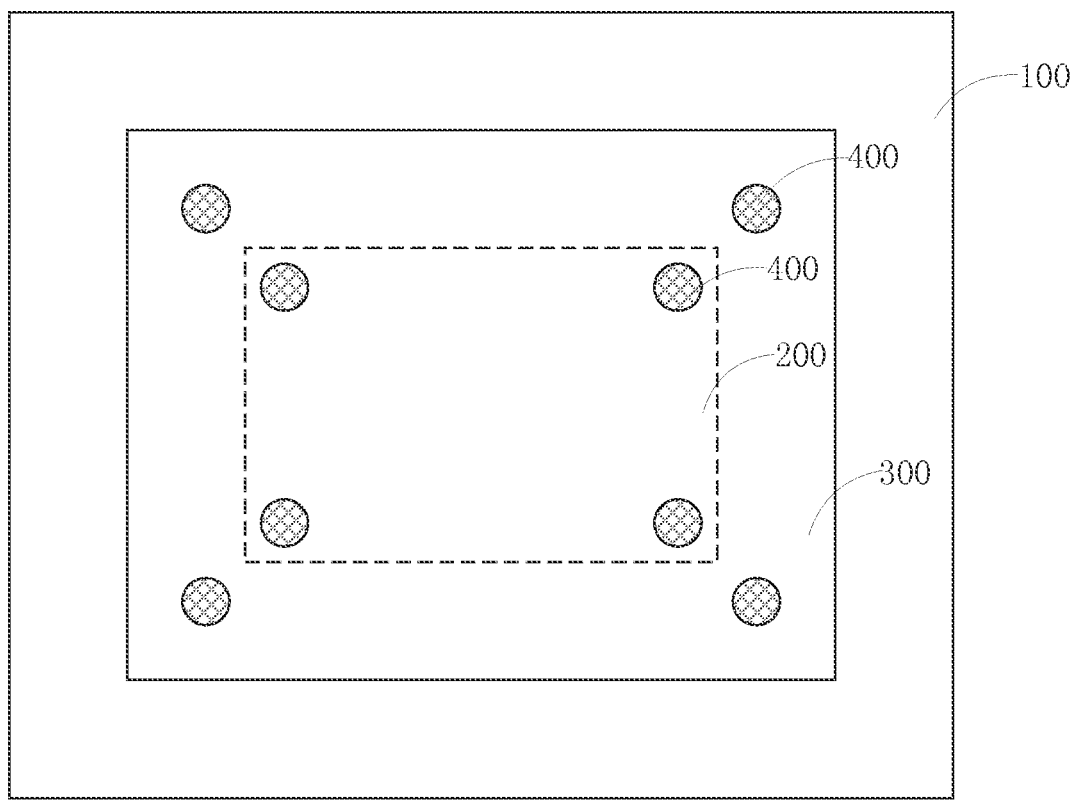
FIG. 1 is a schematic view showing, in a simplified manner, a structure of a liquid crystal module according to a preferred embodiment of the present invention in which a positional distribution arrangement of magnetic members is schematically illustrated.

Referring to FIG. 1, FIG. 1 is a schematic view showing, in a simplified manner, a structure of a liquid crystal module according to a preferred embodiment of the present invention in which a positional distribution arrangement of magnetic members is schematically illustrated. As shown in FIG. 1, the present invention provides a liquid crystal module 10, which comprises a back panel 100, a circuit board 200, and a circuit board cover 300. Certainly, the liquid crystal module 10 may additionally comprise a multi-layered structure and optic components. However, those multi-layered structure and optic components are not related to the novel parts of the present invention so that no specific description will be given.

In an embodiment of the present invention, the back panel 100 is made of a metal material, such as SECC (Steel, Electro-galvanized, Cold-Rolled, Coil) electro-galvanized steel plate. The circuit board 200 is fixed to the back panel 100 by magnetic members 400 and the circuit board cover 300 is fixed to the back panel 100 by magnetic members 400.

Specifically, the magnetic members 400 are arranged, in a distributed manner, on the circuit board 200 and the circuit board cover 300. In a preferred embodiment, the magnetic members 400 are respectively set four corners of the circuit board 200 and those of the circuit board cover 300, but the present invention is not limited to such an arrangement. The magnetic members 400 can be arranged at other portions of the circuit board 200 and the circuit board cover 300 if desired.

In an embodiment of the present invention, the magnetic members 400 are mounted in the circuit board 200 and the circuit board cover 300 through integral plastic molding.

In other embodiments, the magnetic members 400 can be mounted to the circuit board 200 and the circuit board cover 300 through inlaying or adhesive bonding.

Apparently, those skilled in the art may envisage mounting the magnetic members 400 to the circuit board 200 and the circuit board cover 300 can be realized by inlaying applied in combination with adhesive bonding, such as application of powerful adhesives, in order to ensure the bonding stability between the magnetic members 400 and the circuit board cover 300. Inlaying can be done with the known technique of interference fitting and snap fitting.

Figure 2:
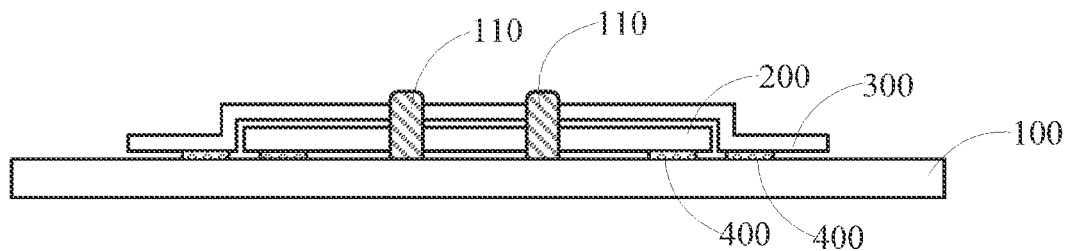
FIG. 2 is a schematic view illustrating a cross-sectional structure of a liquid crystal module according to a preferred embodiment of the present invention, in which a positional distribution arrangement of positioning pieces and positioning sections is schematically illustrated.

Also referring to FIG. 2, FIG. 2 is a schematic view illustrating a cross-sectional structure of a liquid crystal module according to a preferred embodiment of the present invention, in which a positional distribution arrangement of positioning pieces and positioning sections is schematically illustrated.

As shown in FIG. 2, in an embodiment of the present invention, the back panel 100 is provided with positioning pieces and the circuit board 200 and the circuit board cover 300 are provide with positioning sections corresponding to the positioning pieces.

Specifically, the positioning pieces are positioning pins 110 projecting from the back panel 100. The positioning pins 110 can be formed on the back panel 100 through for example stamping, welding, and inlaying. The positioning sections are positioning holes (not labeled) formed in the circuit board 200 and the circuit board cover 300. Through insertion of the positioning pins 110 into the positioning holes, the circuit board 200 and the circuit board cover 300 can be precisely mounted. In the instant embodiment, the positioning holes of the circuit board 200 are set in alignment with those of the circuit board cover 300 so that they receive the same positioning pins 110 extending therethrough.

Figure 3:
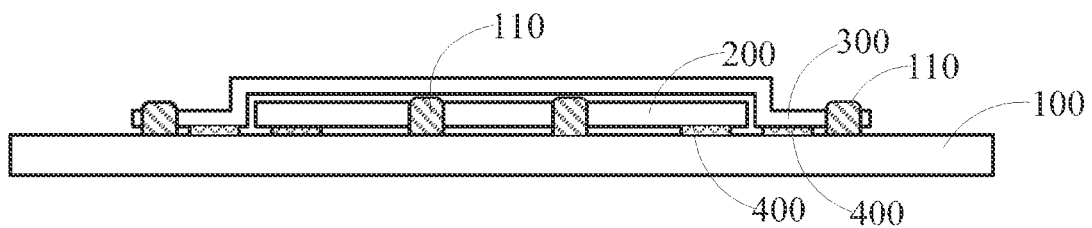
FIG. 3 is a schematic view illustrating a cross-sectional structure of a liquid crystal module according to a preferred embodiment of the present invention, in which another positional distribution arrangement of positioning pieces and positioning sections is schematically illustrated.

Also referring to FIG. 3, FIG. 3 is a schematic view illustrating a cross-sectional structure of a liquid crystal module according to a preferred embodiment of the present invention, in which another positional distribution arrangement of positioning pieces and positioning sections is schematically illustrated.

The instant embodiment is substantially similar to the embodiment shown in FIG. 2 and those similar parts will not be repeatedly described. The difference is that in the instant embodiment, the circuit board 200 and the circuit board cover 300 have positioning holes that are not in alignment with each other and that receive different back panel 100 extending therethrough. In a preferred embodiment, the positioning holes of the circuit board 200 and those of the circuit board cover 300 are arranged at locations close to the magnetic members 400 thereof.

Apparently, the positioning pins 110 that position the circuit board cover 300 are not limited to being set on the back panel 100 and may be alternatively set on the circuit board 200.

In addition, the present invention also provides a display device, such as a flat panel display device, which includes the liquid crystal module 10 described above.

In summary, those skilled in the art may appreciate that the display device, the liquid crystal module, and the fixing structure thereof disclosed in the present invention use magnetic members to fix the circuit board and the circuit board cover to the back panel. This simplifies the assembling operation, allows of easy maintenance and replacement of the circuit board, makes it possible to efficiently remove the circuit board cover for conducting flaw inspection and related electrical test on the circuit board, improves the production efficiency of liquid crystal display devices, and lowers down the manufacturing cost. When it attempts to maintain or replace the circuit board or when it attempts to conduct flaw inspection and related electrical test on the liquid crystal module, there is no need to remove screws with a screwdriver and the circuit board and the circuit board cover can be simply removed by forcibly pulling off, this being of high efficiency and great convenience.

Example embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:
1. A liquid crystal module, comprising:
a back panel made of a metal material;

a circuit board, which is attached to the back panel by magnetic members, wherein the magnetic members are mounted to the circuit board, and no magnetic member is mounted to the back panel such that the circuit board is attached to the back panel by the first magnetic members; and a circuit board cover, which is attached to the back panel by magnetic members, wherein the magnetic members are mounted to the circuit board cover, and no magnetic member is mounted to the back panel such that the circuit board cover is attached to the back panel by the second magnetic members; and wherein the back panel is provided with at least one positioning piece, wherein the circuit board and the circuit board cover form positioning sections mateable with the positioning piece, and wherein the positioning piece is a positioning pin and the positioning sections are positioning holes.

2. The liquid crystal module as claimed in claim 1, wherein the magnetic members are mounted to the circuit board and the circuit board cover through integral plastic molding, inlaying, bonding adhesive.

3. The liquid crystal module as claimed in claim 1, wherein the magnetic members are arranged on the circuit board cover in a distributed manner.

4. The liquid crystal module as claimed in claim 3, wherein the magnetic members are respectively set at four corners of the circuit board cover.

5. A display device, which comprises a liquid crystal module, the liquid crystal module comprising:

a back panel made of a metal material;

a circuit board, which is attached to the back panel by magnetic members, wherein the magnetic members are mounted to the circuit board, and no magnetic member is mounted to the back panel such that the circuit board is attached to the back panel by the first magnetic members; and a circuit board cover, which is attached to the back panel by magnetic members, wherein the magnetic members are mounted to the circuit board cover, and no magnetic member is mounted to the back panel such that the circuit board cover is attached to the back panel by the second magnetic members; and wherein the back panel is provided with at least one positioning piece, wherein the circuit board and the circuit board cover form positioning sections mateable with the positioning piece, and wherein the positioning piece is a positioning pin and the positioning sections are positioning holes.

6. The display device as claimed in claim 5, wherein the magnetic members are mounted to the circuit board and the circuit board cover through integral plastic molding, inlaying, bonding adhesive.

7. The display device as claimed in claim 5, wherein the magnetic members are arranged on the circuit board cover in a distributed manner.

8. The display device as claimed in claim 7, wherein the magnetic members are respectively set at four corners of the circuit board cover.

9. A fixing structure adapted to fix a circuit board and a circuit board cover of a liquid crystal module to a back panel which is made of a metal material, the fixing structure comprising magnetic members that are mounted to the circuit board and the circuit board cover respectively, and no magnetic member is mounted to the back panel, whereby with magnetic forces that the magnetic members apply to attractively couple to the back panel, the circuit board and the circuit board cover are fixed to the back panel; and wherein the back panel is provided with at least one positioning piece, wherein the circuit board and the circuit board cover form positioning sections mateable with the positioning piece, and wherein the positioning piece is a positioning pin and the positioning sections are positioning holes.

10. The fixing structure as claimed in claim 9, wherein the magnetic members are mounted to the circuit board and the circuit board cover through integral plastic molding, inlaying, bonding adhesive.

* * * * *